(12) United States Patent
Boskamp et al.

(10) Patent No.: US 6,498,947 B2
(45) Date of Patent: Dec. 24, 2002

(54) RF SHIELDING METHOD AND APPARATUS

(75) Inventors: Eddy B. Boskamp, Menomonee Falls, WI (US); Richard P. Mallozzi, Clifton Park, NY (US); William A. Edelstein, Schenectady, NY (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 10 days.

(21) Appl. No.: 09/791,307

(22) Filed: Feb. 23, 2001

(65) Prior Publication Data

US 2002/0120191 A1 Aug. 29, 2002

(51) Int. Cl.$^7$ ................................. A61B 5/05
(52) U.S. Cl. ................ 600/422; 600/407; 600/410; 324/318
(58) Field of Search ................ 600/422, 407, 600/410; 324/318

(56) References Cited

U.S. PATENT DOCUMENTS 5,990,681 A  * 11/1999  Richard et al. ............. 324/318

* cited by examiner

*Primary Examiner*—Marvin M. Lateef
*Assistant Examiner*—Devaang Shah
(74) *Attorney, Agent, or Firm*—Fletcher, Yoder & Van Someren

(57) ABSTRACT

A technique is disclosed for shielding rf magnetic fields in MRI systems. An rf shield is embedded in a gradient coil structure including X-, Y- and Z-axis coils. The rf shield is positioned between an inner gradient coil which is inherently decoupled from the rf field, and the remaining coils which require rf shielding. The inner gradient coil may be a Z-axis coil wound as a solenoid, the field of which is generally orthogonal with respect to the rf magnetic field. The rf shield is thereby placed at an enhanced distance from the rf coil, providing greater efficiency and permitting energy levels to be reduced to obtain the desired rf magnetic field strength.

24 Claims, 3 Drawing Sheets

RF SHIELDING METHOD AND APPARATUS

FIELD OF THE INVENTION

The present invention relates generally to the field of magnetic resonance imaging systems, such as those used for medical diagnostic applications. More particularly, the invention relates to a technique for shielding gradient coils in magnetic resonance imaging systems from radiofrequency magnetic fields generated during the course of examinations.

BACKGROUND OF THE INVENTION

Magnetic resonance imaging (MRI) systems have become ubiquitous in the field of medical diagnostics. Over the two past decades, improved techniques for MRI examinations have been developed that now permit very high-quality images to be produced in a relatively short time. As a result, diagnostic images with varying degrees of resolution are available to the radiologist that can be adapted to particular diagnostic applications.

In general, MRI examinations are based on the interactions among a primary magnetic field, a radiofrequency (rf) magnetic field and time varying magnetic gradient fields with nuclear spins within the subject of interest. Specific nuclear components, such as hydrogen nuclei in water molecules, have characteristic behaviors in response to external magnetic fields. The precession of spins of such nuclear components can be influenced by manipulation of the fields to obtain rf signals that can be detected, processed, and used to reconstruct a useful image.

The magnetic fields used to produce images in MRI systems include a highly uniform, static magnetic field that is produced by a primary magnet. A series of gradient fields are produced by a set of three gradient coils disposed around the subject. The gradient fields encode positions of individual volume elements or voxels in three dimensions. A radiofrequency coil is employed to produce an rf magnetic field. This rf magnetic field perturbs the spin system from its equilibrium direction, causing the spins to precess around the axis of their equilibrium magnetization. During this precession, radiofrequency fields are emitted by the spins and detected by either the same transmitting rf coil, or by a separate receive-only coil. These signals are amplified, filtered, and digitized. The digitized signals are then processed using one of several possible reconstruction algorithms to reconstruct a useful image.

Many specific techniques have been developed to acquire MR images for a variety of applications. One major difference among these techniques is in the way gradient pulses and rf pulses are used to manipulate the spin systems to yield different image contrasts, signal-to-noise ratios, and resolutions. Graphically, such techniques are illustrated as "pulse sequences" in which the pulses are represented along with temporal relationships among them. In recent years, pulse sequences have been developed which permit extremely rapid acquisition of a large amount of raw data. Such pulse sequences permit significant reduction in the time required to perform the examinations. Time reductions are particularly important for acquiring high resolution images, as well as for suppressing motion effects and reducing the discomfort of patients in the examination process.

While field interactions are fundamental to the encoding of data acquired in MRI systems, certain field interactions are undesirable, or may lead to degradation of the image data. For example, when the appropriate pulses are applied to an rf coil during an examination sequence, rf energy from the rf coil can penetrate the gradient coil structure where it is dissipated by lossy eddy currents induced in the gradient coil structure. To maintain a high efficiency of the rf coil, then, an rf shield is typically positioned between the rf coil and the gradient coil set so as to prevent or reduce penetration of the rf magnetic field into all of the gradient coils. The design of the rf shield is such that minimal eddy currents are generated by switching of the gradient fields, rendering the rf shield substantially transparent to the gradient fields. At the same time, the rf frequencies are much higher than characteristic eddy current decay rates in the shield, hence the shield functions like an impenetrable barrier to rf fields.

The proximity of an rf shield to the gradient coil conductors, particularly in the case of a whole body rf transmit coil, may significantly affect the overall power efficiency and the signal-to-noise ratio of the rf coil. In general, it is desirable to place the rf shield as far as possible from the rf coil. Where the power efficiency is reduced, larger amounts of power may need to be supplied to the rf coil, leading to the use of larger power amplifiers to obtain a desired magnitude of the rf magnetic field. Larger currents may also be required for the rf coil conductors, potentially leading to unacceptably high levels of energy within the patient bore. Moreover, coupling with the shield effectively increases the series resistance of the rf coil and lowers the inductance. These combined effects may result in a low quality factor (sometimes referred to at "Q" in the art), and a consequent reduction in signal to noise ratio.

There is a need, therefore, for an improved technique for shielding rf magnetic fields in MRI systems. There is, at present, a particular need for a technique which can be employed in a straightforward manner to enhance both the power efficiency of the rf coil and the signal-to-noise ratio to address the drawbacks in hereto for known systems.

SUMMARY OF THE INVENTION

The present invention provides a radiofrequency shielding technique designed to respond to such needs. The technique may be employed in a wide range of systems, but is particularly suitable to magnetic resonance imaging systems, such as those used in medical diagnostic applications. The technique may also be employed in any suitable MRI scanner design, including full body scanners, open scanners, and scanners with a range of field ratings. Where appropriate, the technique may be used to retrofit existing scanners, or may be incorporated into new designs, particularly in the configuration of the gradient coil structure.

The technique makes use of a novel arrangement of gradient coils and an rf shield. In one embodiment, the rf shield is placed between the gradient coils, with a modified solenoid-type coil, commonly the Z-axis gradient coil, positioned within the shield, that is, between the shield and the rf transmit coil. Because the mode of the rf coil that is typically used in MRI has little or no net magnetic flux in the Z-axis direction, the coupling between the rf coil and the Z-axis gradient coil is minimal. Hence the radiofrequency field will be disturbed very little by the presence of the Z-axis gradient coil on the interior of the shield surface, enabling the rf shield to be moved significantly away from the transmit coil as compared to known designs. The technique has been demonstrated to provide a significant reduction in noise and increased efficiency, allowing for use of a smaller rf amplifier than in conventional systems, or for reduced power input to the rf transmit coil to obtain the desired rf magnetic field strength.

DETAILED DESCRIPTION OF THE INVENTION

Figure 1:
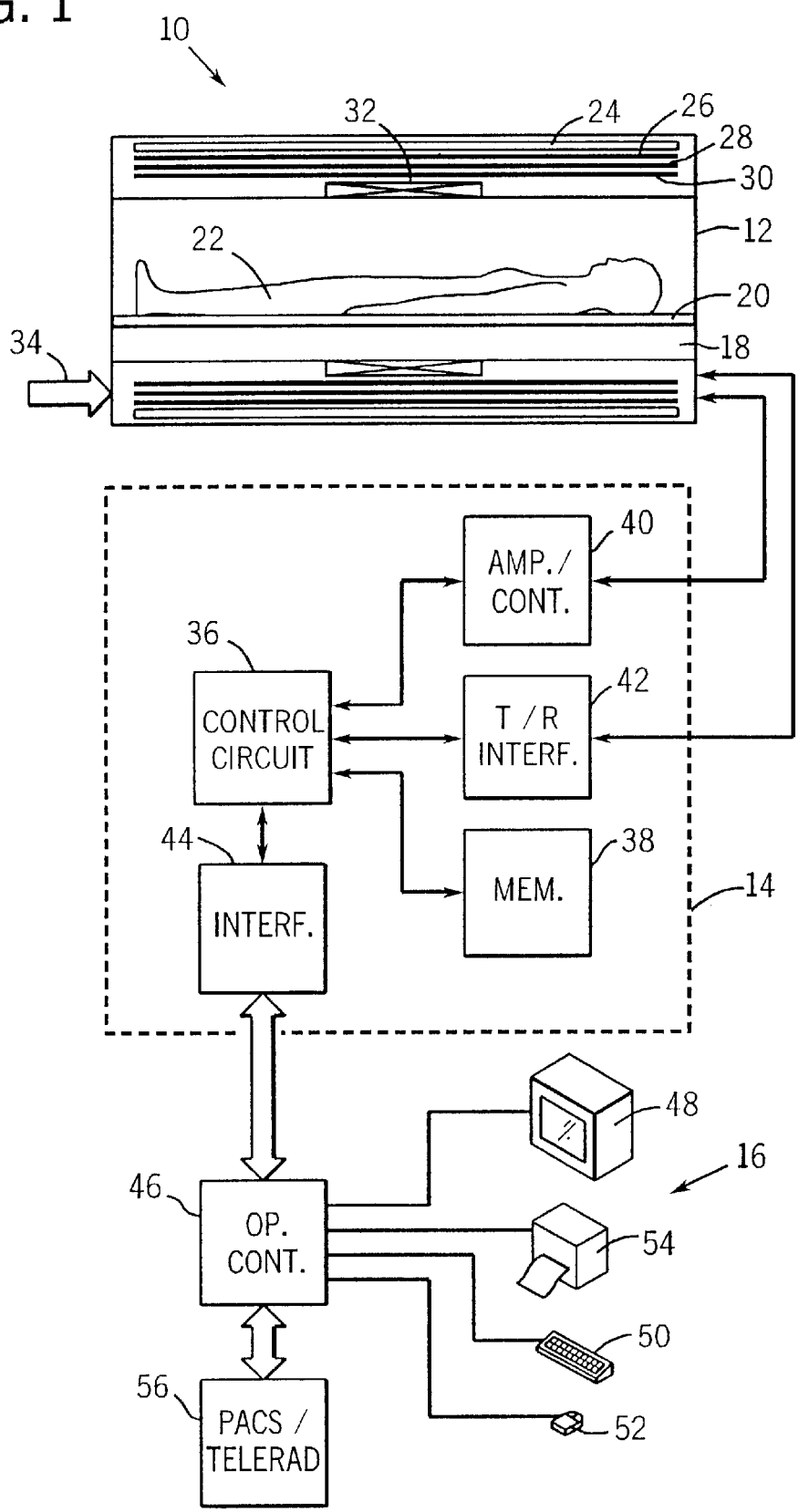
FIG. 1 is a diagrammatical representation of an MRI system for use in medical diagnostic imaging and implementing certain aspects of the present shielding technique.

Turning now to the drawings, and referring first to FIG. 1, a magnetic resonance imaging (MRI) system 10 is illustrated diagrammatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radiofrequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. A radiofrequency coil 32 is provided for generating radiofrequency pulses for exciting the gyromagnetic material. In the embodiment illustrated in FIG. 1, coil 32 also serves as a receiving coil. Thus, rf coil 32 may be coupled with driving and receiving circuitry in passive and active modes for receiving emissions from the gyromagnetic material and for applying radiofrequency excitation pulses, respectively. Alternatively, various configurations of receiving coils may be provided separate from rf coil 32. Such coils may include structures specifically adapted for target anatomies, such as head coil assemblies, and so forth. Moreover, receiving coils may be provided in any suitable physical configuration, including phased array coils, and so forth. As described more fully below, the present technique includes positioning of a radiofrequency shield 90 (See, e.g., FIG. 4) between the gradient coils to shield the rf magnetic field from the gradient coils which may be affected by the field during operation.

In a present configuration, the gradient coils 26, 28 and 30 have different physical configurations adapted to their function in the imaging system 10. As will be appreciated by those skilled in the art, the coils are comprised of conductive wires, bars or plates which are wound or cut to form a coil structure which generates a gradient field upon application of control pulses as described below. The placement of the coils within the gradient coil assembly may be done in several different orders, but in the present embodiment, a Z-axis coil is positioned at an innermost location, and is formed generally as a solenoid-like structure which has relatively little impact on the rf magnetic field. Thus, in the illustrated embodiment, gradient coil 30 is the Z-axis solenoid coil, while coils 26 and 28 are Y-axis and X-axis coils respectively.

The coils of scanner 12 are controlled by external circuitry to generate desired fields and pulses, and to read signals from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an rf frequency pulse is generated at or near the Larmor frequency of the material of interest, resulting in rotation of the net aligned moment to produce a net transverse magnetic moment. This transverse magnetic moment precesses around the main magnetic field direction, emitting rf signals that are detected by the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions can be applied along the X-, Y- and Z-axis of the original coordinate system or along other axes determined by combinations of pulsed currents applied to the individual field coils.

The slice select gradient determines a slab of tissue or anatomy to be imaged in the patient. The slice select gradient field may be applied simultaneously with a frequency selective rf pulse to excite a known volume of spins within a desired slice that precess at the same frequency. The slice thickness is determined by the bandwidth of the rf pulse and the gradient strength across the field of view.

The frequency encoding gradient is also known as the readout gradient, and is usually applied in a direction perpendicular to the slice select gradient. In general, the frequency encoding gradient is applied before and during the formation of the MR echo signal resulting from the rf excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

As will be appreciated by those skilled in the art, a great number of variations may be devised for pulse sequences employing the exemplary gradient pulse functions described above as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radiofrequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving rf coil 32. Moreover, where the rf coil serves both to emit the radiofrequency excitation pulses and to receive MR signals, circuitry 42 will typically include a switching device for toggling the rf coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Figure 2:
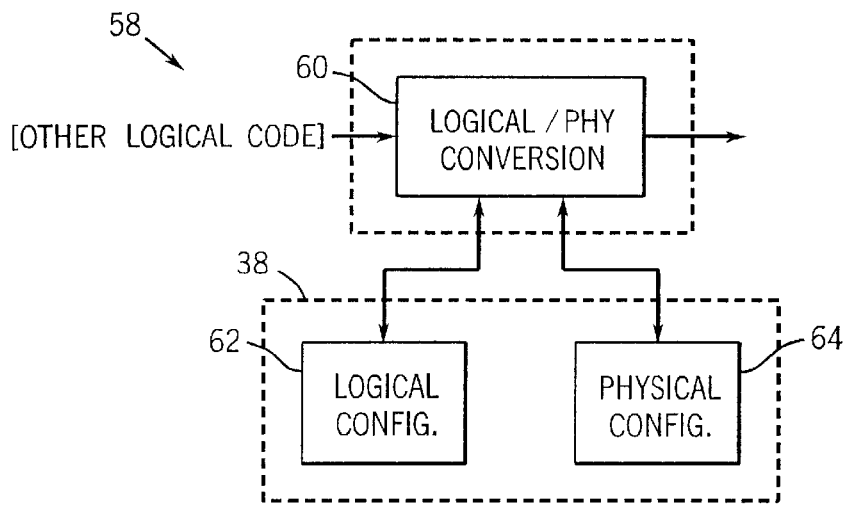
FIG. 2 is a block diagram of functional components of an exemplary pulse sequence description module in a controller for a system of the type illustrated in FIG. 1.

In general, pulse sequences implemented in the MRI system will be defined by both functional and physical configuration sets and parameter settings stored within control circuitry 14. FIG. 2 represents, diagrammatically, relationships between functional components of control circuit 36 and configuration components stored with memory circuitry 38. The functional components facilitate coordination of the pulse sequences to accommodate preestablished settings for both functional and physical axes of the system. In general, the axis control modules, denoted collectively by reference numeral 58, include a functional-to-physical module 60 which is typically implemented via software routines executed by control circuit 36. In particular, the conversion module is implemented through control routines that define particular pulse sequences in accordance with preestablished imaging protocols.

When called upon, code defining the conversion module references functional sets 62 and physical configuration sets 64. The functional configuration sets may include parameters such as pulse amplitudes, beginning times, time delays, and so forth, for the various logical axes described above. The physical configuration sets, on the other hand, will typically include parameters related to the physical constraints of the scanner itself, including maximum and minimum allowable currents, switching times, amplification, scaling, and so forth. Conversion module 60 serves to generate the pulse sequence for driving the coils of scanner 12 in accordance with constraints defined in these configuration sets. The conversion module will also serve to define adapted pulses for each physical axis to properly orient (e.g. rotate) slices and to encode gyromagnetic material in accordance with desired rotation or reorientations of the physical axes of the image.

Figure 3:
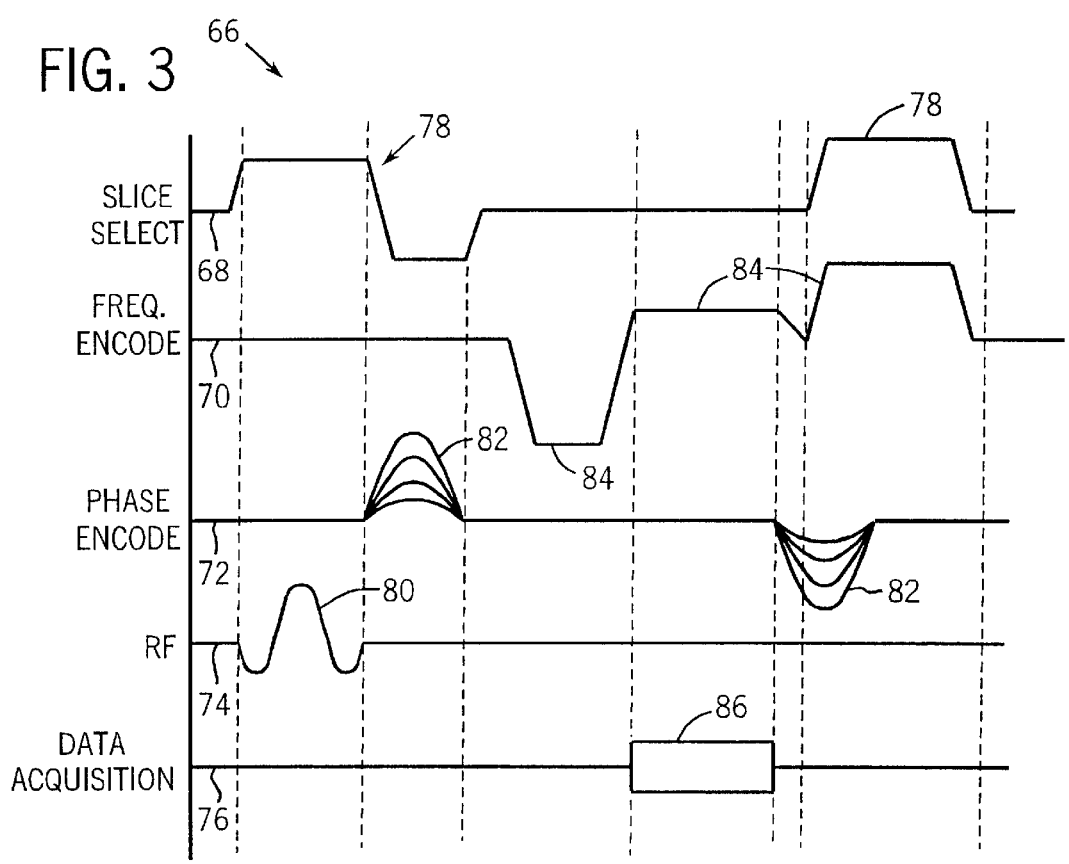
FIG. 3 is a graphical representation of an exemplary pulse sequence description for an MRI examination which may be implemented in the system of FIG. 1.

By way of example, FIG. 3 illustrates a typical pulse sequence which may be implemented on a system such as that illustrated in FIG. 1 and calling upon configuration and conversion components such as those shown in FIG. 2. While many different pulse sequence definitions may be implemented, depending upon the examination type, in the example of FIG. 3, a gradient recalled acquisition in steady state mode (GRASS) pulse sequence is defined by a series of pulses and gradients appropriately timed with respect to one another. The pulse sequence, indicated generally by reference numeral 66, is thus defined by pulses on a slice select axis 68, a frequency encoding axis 70, a phase encoding axis 72, an rf axis 74, and a data acquisition axis 76. In general, the pulse sequence description begins with a pair of gradient pulses on slice select axis 68 as represented at reference numeral 78. During a first of these gradient pulses, an rf pulse 80 is generated to excite gyromagnetic material in the subject. Phase encoding pulses 82 are then generated, followed by a frequency encoding gradient 84. A data acquisition window 86 provides for sensing signals resulting from the excitation pulses which are phase and frequency encoded. The pulse sequence description terminates with additional gradient pulses on the slice select, frequency encoding, and phase encoding axes.

During the examination sequences such as the exemplary sequence described above, electromagnetic interactions, such as rf coupling between the rf and gradient coils, may adversely affect the operation of the system. For example, the presence of the gradient coils (particularly the X and Y-axis coils) will increase the series resistance of the rf coil and may alter its frequency due to inductive and capacitive coupling. Moreover, the efficiency of the rf coil and the signal-to-noise ratio may be jeopardized. Such interactions may also significantly affect the rf magnetic field if allowed to penetrate into the lossy material making up the gradient coils. In particular, it has been found that the X-axis coil 26 and the Y-axis coil 28 have strong interactions with the rf field if the rf field is allowed to penetrate into those regions of the gradient coil. This leads to undesirable rf losses and a reduction in performance (efficiency and Q, a common performance measure) of the rf coil. In heretofore known systems, rf shields have been positioned at an inner location between the entire set of gradient coils and the rf coil to shield the gradient coils from interaction with the rf magnetic field. In accordance with the present technique, an rf shield is placed at an intermediate position within the gradient coil assembly as illustrated in FIG. 4.

Figure 4:
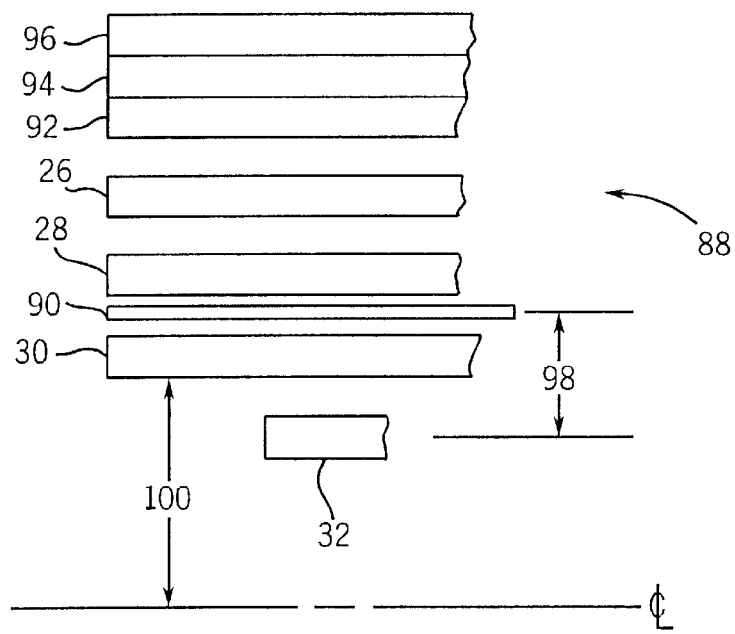
FIG. 4 is a diagrammatical representation of the layout of gradient coils and an rf shield between the gradient coils in accordance with the aspects of the present technique.

Referring to FIG. 4, the coil assembly 88 includes the inner gradient coils 26, 28 and 30 described above, and an rf shield 90 placed between the innermost gradient coil 30 and the next adjacent gradient coil 28. In a present embodiment, the innermost gradient coil 30 is a modified solenoid-type coil, such as the Z-axis coil. In practice, as will be appreciated by those skilled in the art, the Z-axis coil includes a series of loops in series in a generally solenoid-like arrangement, but with progressively varying pitch. Moreover, the direction of winding is reversed at a center position to produce a mirror-image, symmetrical structure with respect to a transverse XY plane. The rf shield 90 may be any suitable form of shield such as one or more thin sheets of conductive material, such as copper. Alternative forms of rf shields may be adapted to the specific scanner structure. Examples of such scanner structures include cylindrical and planar structures such as those used in open MRI systems. In each of these cases, however, the rf shield is placed within the gradient coils to take advantage of the relatively minor influence of the transverse rf magnetic field on the solenoid-type or Z-axis coil, and to position the shield at an advantageously greater distance from the rf coil 32.

As noted above, in accordance with the present technique, any suitable form of rf shield may be provided at the locations described. For example, the shield effectively appears as a solid cylinder that is impenetrable at rf frequencies, at least in the cylindrical arrangement illustrated. However, the shield may include openings or voids which render the shield more transparent to gradient magnetic fields. These openings or voids are generally designed to preserve as well as possible the shielding effect on the rf fields. The shield also may include multiple layers of material with capacitance between the layers, such that at the rf frequencies employed in operation the shield functions as a solid shield. In another implementation, the shield may be formed of a single layer of copper mesh, the mesh size and thickness being chosen such that the shield reflects at rf frequencies and yet is transparent for the gradient fields.

In the present embodiment illustrated in FIG. 4, outer gradient coils are provided beyond the inner gradient coils. These outer gradient coils, designated by reference numerals 92, 94 and 96 in FIG. 4, make up the remainder of the gradient coil structure. The function of the outer gradient coils is to cancel the gradient magnetic fields, as well as possible, in the regions outside the patient imaging volume to minimize interaction with components of the cryostat structure and other metallic parts of the magnet structure. As will be appreciated by those skilled in the art, each gradient coil of the structure includes one or more conductive elements supported on a support structure, such as a fiberglass resin composite tube.

It should be noted that the positioning of the rf shield 90 between coils 28 and 30 in the coil assembly 88 results in an increased distance 98 between the rf coil 32 and the shield 90 as compared to heretofore known structures. Because the gradient coils 26 and 28 are very lossy at the rf frequencies employed in the pulse sequences, the rf shield 90 prevents or greatly reduces the penetration of the rf field into these coils, thereby avoiding the loss of energy. The greater distance 98 from the rf coil 32 enabled by the structure of FIG. 4, thereby permits reductions in the amount of energy which may be supplied to the rf coil to obtain the desired magnetic field strength. Moreover, it has been found that by distancing the rf shield from the rf coil through its position intermediate the gradient coils, a significant improvement in the signal-to-noise ratio can be obtained. Thus, the system may be provided with a reduced-size rf amplifier, and problems associated with higher rf energies in heretofore known systems are avoided.

Moreover, an important advantage of the present technique is the considerable enhancement in the efficiency of the gradient coils by virtue of the placement of the rf shield within the gradient coil assembly. In particular, the assembly permits the primary gradient coils to be placed a reduced distance 100 from the longitudinal center line of the field system, improving the efficiency of the gradient coils. Indeed, the efficiency of a gradient coil is extremely sensitive to the distance between the primary gradient windings and the gradient shielding windings. Thus, the reduced distance 100 enables a greater distance between the primary and shield windings of all three gradient coils, giving a very significant improvement to all three gradient coil assemblies.

Figure 5:
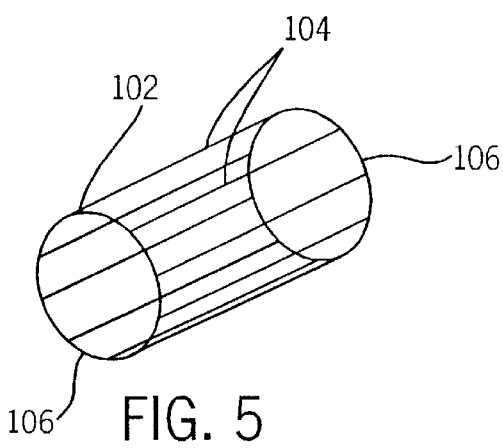
FIG. 5 is a diagrammatical representation of an exemplary whole body rf coil as might be used in the arrangement shown in FIG. 4.

As noted above, any suitable rf coil, shield, and gradient coil structures may be employed in the present embedded rf shield technique. In a present embodiment, however, a birdcage coil structure 102, illustrated in FIG. 5, is employed as an exemplary whole body coil. As will be appreciated by those skilled in the art, such coil structures include longitudinal conductors 104 and conductive end rings 106. Pulses applied to the conductors are driven at a desired frequency, such as 64 MHz, to excite a particular mode of the rf coil.

Figure 6:
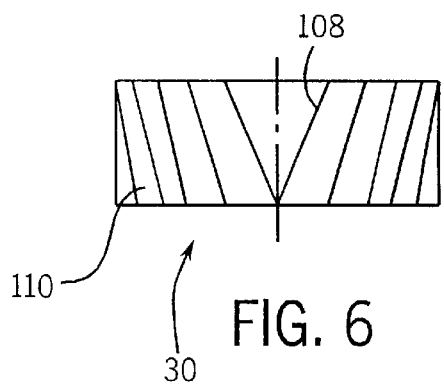
FIG. 6 is a diagrammatical representation of an exemplary Z-axis gradient coil which may be used in a whole body coil structure such as that illustrated in FIG. 4.

An exemplary Z-axis coil is illustrated in FIG. 6, as formed generally as a modified wound solenoid coil as discussed above, with progressive turns of the solenoid conductor being spaced at varying distances or pitch along the length and about either side of a transverse center plane. In addition, the winding direction is reversed on either side of the transverse center plane. Thus, coil 30 will include a wound conductor 108, such as a copper wire, rod or bar, supported on a cylindrical support structure 110. In the preferred embodiment, the form of the Z-axis coil 30 allows for inherent decoupling from the rf magnetic field produced by the rf coil due to the orthogonal orientations of the fields produced by these coils.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A magnetic resonance imaging scanner comprising:
   a patient support;
   a primary magnet at least partially surrounding the patient support for generating a primary magnetic field;
   a first gradient coil disposed between the primary magnet and the patient support for generating a first gradient field;
   a second gradient coil disposed between the first gradient coil and the patient support for generating a second gradient field;
   a third gradient coil disposed between the second gradient coil and the patient support for generating a third gradient field;
   a radiofrequency coil disposed between the third gradient coil and the patient support; and
   a radiofrequency shield disposed between the second and third gradient coils for shielding radiofrequency emissions from the radiofrequency coil.

2. The scanner of claim 1, wherein the first and second gradient coils are X-axis and Y-axis gradient coils.

3. The scanner of claim 1, wherein the third gradient coil is a Z-axis gradient coil, the field of which is inherently decoupled from the radiofrequency field during operation.

4. The scanner of claim 3, wherein the third gradient coil is wound as a modified solenoid.

5. The scanner of claim 1, wherein the radiofrequency shield includes a conductive assembly or mesh interposed between the second and third gradient coils.

6. The scanner of claim 1, wherein the gradient coils and the radiofrequency shield are assembled as a unitary coil assembly.

7. The scanner of claim 1, wherein the primary magnet, the gradient coils and the radiofrequency shield are cylindrical.

8. The scanner of claim 1, further comprising driver circuitry coupled to the gradient coils and to the radiofrequency coil for generating controlled pulse sequences of an imaging routine.

9. A magnetic resonance imaging system comprising:
   a system controller configured to generate controlled pulse sequences for exciting gyromagnetic material in a subject of interest;
   interface circuitry coupled to the controller for applying the pulse sequences to a set of coils and for receiving signals acquired during an examination;
   a primary magnet for generating a primary magnetic field;
   a set of gradient coils within the primary magnetic field and coupled to the interface circuitry for generating gradient fields in response to the pulse sequences, the gradient coils including three coaxially stacked coil assemblies;
   a radiofrequency coil coupled to the interface circuitry for generating a radiofrequency field; and
   a radiofrequency shield disposed intermediate the stacked coil assemblies of the set of gradient coils to shield at least one of the gradient coils from the radiofrequency field.

10. The system of claim 9, wherein the gradient coils include X, Y and Z-axis coils and the radiofrequency shield is disposed between the X or Y-axis coil and the Z-axis coil.

11. The system of claim 10, wherein the Z-axis coil includes solenoid winding that reverses polarity at its center.

12. The system of claim 9, wherein the gradient coils and the radiofrequency shield form a coaxial cylindrical structure surrounding a patient support.

13. A gradient coil assembly for a magnetic resonance imaging system, the coil assembly comprising:
   an X-axis gradient coil;
   a Y-axis gradient coil disposed coaxial with and radially within the X-axis gradient coil;
   a Z-axis gradient coil disposed coaxial with and radially within the Y-axis gradient coil; and
   an rf shield disposed between the X or Y-axis gradient coil and the Z-axis gradient coil.

14. The gradient coil assembly of claim 13, wherein the gradient coils are each supported on cylindrical supports and wherein the gradient coils and the rf shield are assembled into a unitary structure.

15. The gradient coil assembly of claim 13, wherein the rf shield includes a layer of metallic assembly or mesh.

16. The gradient coil assembly of claim 15, wherein the metallic assembly or mesh comprises copper.

17. A method for shielding rf fields in a magnetic resonance imaging system, the method comprising the steps of:
   disposing first and second gradient coils adjacent to one another in a gradient coil assembly;
   disposing an rf shield adjacent to the second gradient coil; and
   disposing a third gradient coil adjacent to the rf shield.

18. The method of claim 17, wherein the first and second gradient coils are X and Y-axis coils and the third gradient coil is a Z-axis coil.

19. The method of claim 17, wherein the gradient coils and the rf shield are cylindrical structures disposed coaxially with respect to one another.

20. A method for generating magnetic resonance imaging data, the method comprising the steps of:
   applying controlled pulses to a gradient coil assembly in the presence of a primary magnetic field, the coil assembly including, from a primary magnet towards a subject of interest, first and second gradient coils, an rf shield, and a third gradient coil;
   applying controlled pulses to an rf coil disposed between the coil assembly and the subject to generate an rf field, the rf field being shielded from the first and second gradient coils by the rf shield; and
   detecting emissions from the subject of interest for generating image data.

21. The method of claim 20, wherein the first and second gradient coils are X and Y-axis gradient coils and the third gradient coil is a Z-axis gradient coil.

22. The method of claim 20, wherein the gradient coils and the rf shield are disposed in radially coaxial positions to form a cylindrical assembly surrounding a patient support.

23. A magnetic resonance imaging system comprising:
   a primary magnet;
   means for generating three mutually orthogonal gradient fields;
   means for generating an rf field; and
   means disposed between the means for generating the gradient fields for partially shielding the means for generating the gradient fields from the rf field.

24. The system of claim 23, further comprising:
   means for applying controlled pulses to the means for generating the gradient fields in the presence of a primary magnetic field;
   means for applying controlled pulses to the means for generating the rf field to generate an rf field; and
   means for detecting emissions from the subject of interest for generating image data.

* * * * *